(12) United States Patent
Jo et al.

(10) Patent No.: US 12,025,642 B2
(45) Date of Patent: Jul. 2, 2024

(54) DIELECTRIC CONSTANT MEASUREMENT METHOD, DIELECTRIC MEASUREMENT DEVICE AND DIELECTRIC MEASUREMENT PROGRAM

(71) Applicant: Nippon Telegraph and Telephone Corporation, Tokyo (JP)

(72) Inventors: Teruo Jo, Tokyo (JP); Hiroshi Hamada, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 102 days.

(21) Appl. No.: 17/786,867

(22) PCT Filed: Dec. 20, 2019

(86) PCT No.: PCT/JP2019/050148
§ 371 (c)(1),
(2) Date: Jun. 17, 2022

(87) PCT Pub. No.: WO2021/124563
PCT Pub. Date: Jun. 24, 2021

(65) Prior Publication Data
US 2023/0038341 A1   Feb. 9, 2023

(51) Int. Cl.
*G01V 3/10* (2006.01)
*G01N 21/3581* (2014.01)
*G01R 27/26* (2006.01)

(52) U.S. Cl.
CPC ..... *G01R 27/2617* (2013.01); *G01N 21/3581* (2013.01)

(58) Field of Classification Search
CPC .. G01N 21/3581; G01N 27/221; G01N 22/00; G01N 22/04; G01N 33/38; G01N 33/42; G01R 27/2617
See application file for complete search history.

(56) References Cited

U.S. PATENT DOCUMENTS

| 7,649,633 B2 * | 1/2010 | Kawate | G01N 21/8422 |
| | | | 356/504 |
| 10,908,096 B2 * | 2/2021 | Troxler | G01N 22/00 |

(Continued)

OTHER PUBLICATIONS

Jyo, T. et al., "An Accurate Permittivity Measurement Using Interferometric Phase Noise Averaging for Terahertz Imaging," IEEE Transactions on Terahertz Science and Technology, vol. 8, No. 3, May 2018, 9 pages.

(Continued)

*Primary Examiner* — Thang X Le
(74) *Attorney, Agent, or Firm* — Slater Matsil, LLP

(57) ABSTRACT

A permittivity measuring method includes measuring a set of phases at sampling frequencies of at least three points in each of a first-half portion and a second-half portion of a phase characteristic of electromagnetic waves that passed through a measurement target, if the mode of the phase changes of both sets of phases belongs to a phase group in which change of the at least three points in the first half and change of at least three points in the second half are both monotonic change, maximal values, or minimal values, calculating the permittivity using the phase slope of the phases in the first-half portion and the phases in the second-half portion, and if the mode of the phase changes does not belong to the phase group, calculating the permittivity by fitting the phases of either the first half or the second half to a quadratic function.

8 Claims, 14 Drawing Sheets

(56) References Cited

U.S. PATENT DOCUMENTS

| | | | |
|---|---|---|---|
| 10,983,069 B2* | 4/2021 | Blödt | G01N 22/00 |
| 2009/0009190 A1* | 1/2009 | Itsuji | G01N 21/3581 |
| | | | 324/639 |
| 2009/0309601 A1* | 12/2009 | Simon | G01V 3/30 |
| | | | 324/339 |
| 2017/0322064 A1* | 11/2017 | Sharma | G01F 1/74 |
| 2020/0176283 A1* | 6/2020 | Deo | H01L 21/67103 |

OTHER PUBLICATIONS

Jyo, T. et al., "Terahertz Permittivity Imaging using Two-tone CW for Detecting Contamination in Food," 2016 IEICE General Conference, Mar. 15, 2016, 3 pages.

\* cited by examiner

Fig. 8

| | TWO-TONE (CONVENTIONAL) | PHASE FLUCTUATION AVERAGING (CONVENTIONAL) | EMBODIMENTS OF THE PRESENT INVENTION | |
|---|---|---|---|---|
| | | | FIRST EMBODIMENT | SECOND EMBODIMENT (HAS EXTREME VALUE) |
| NUMBER OF PHASE SAMPLES | 2 | 16 | 6 | 3 |
| ENVISIONED MEASUREMENT TIME (IF 10 ms FOR 1 POINT) | 20ms | 160ms | 60ms | 30ms |
| ESTIMATED SLOPE (TRUE VALUE=2) | 0.64 | 2.02 | 1.98 | 1.98 |
| DIFFERENCE FROM TRUE VALUE | 68% | 1% | 1% | 1% |

DIELECTRIC CONSTANT MEASUREMENT METHOD, DIELECTRIC MEASUREMENT DEVICE AND DIELECTRIC MEASUREMENT PROGRAM

CROSS-REFERENCE TO RELATED APPLICATIONS

This patent application is a national phase filing under section 371 of PCT application no. PCT/JP2019/050148, filed on Dec. 20, 2019, which application is incorporated herein by reference in its entirety.

TECHNICAL FIELD

The present invention relates to a permittivity measuring method, a permittivity measuring device, and a permittivity measuring program for measuring the permittivity of a measurement target using electromagnetic waves.

BACKGROUND

Conventionally, one method of measuring the permittivity of an object (particularly the permittivity at a high frequency such as in the terahertz band) is a two-tone method that uses the amount of phase change between two different frequencies (hereinafter referred to as "phase slope") (NPL 1). With the measurement configuration shown in FIG. 12, first, phases θ1_air and θ2_air are measured after electromagnetic waves having two different frequencies f1 and f2 have passed through the air.

Next, phases θ1_sample and θ2_sample are measured after frequencies f1 and f2 have passed through the measurement target, and phase rotations from the air θ1=θ1_sample−θ1_air and the air θ2=2_sample-θ2_air are calculated.

Next, the relative permittivity er is calculated from the phase slope between the two frequencies according to Expression 1 (FIG. 13). Here, L is the thickness of the measurement target, and c is the speed of light.

Expression 1

$$\theta_2 - \theta_1 = \frac{2\pi(\sqrt{\varepsilon_r} - 1)L}{c}(f_2 - f_1) \quad (1)$$

However, due to the existence of reflected waves in the measurement target (at the boundary between the measurement target and air), the phase frequency characteristic (hereinafter referred to as "phase characteristic") does not change in a straight line relative to the frequency, but rather includes phase fluctuation as shown by a solid line 402 in FIG. 13. Due to the influence of this phase fluctuation, a phase slope 404 calculated from a phase sampling point 401 deviates from a true value 403, and thus the measurement error is high in the two-tone method.

A phase fluctuation averaging method has been proposed as a method of lowering the measurement error (NPL 2). In this method, as shown in FIG. 14, phase sampling is performed at a plurality of sampling points 501 on a phase characteristic 502 that includes phase fluctuation, and then a fitted straight line 503 is obtained by the least squares method, and the slope a of the straight line is used in Expression 2 to calculate the relative permittivity.

However, in the phase fluctuation averaging method, it is necessary to perform phase sampling at small frequency intervals, and therefore there is a problem that the measurement time becomes long in the case of a system in which frequency sweeping is performed.

Expression 2

$$a = \frac{2\pi(\sqrt{\varepsilon_r} - 1)L}{c} \quad (2)$$

CITATION LIST

Non Patent Literature

[NPL 1] Jyo, Teruo, et al., "C-2-89 Terahertz Permittivity Imaging using Two-tone CW for Detecting Contamination in Food (C-2. Microwaves C (Microwave/Millimeter Wave Application Devices), General Session)", IEICE General Conference Proceedings, 2016.1 (2016): 118.

[NPL 2] Jyo, Teruo, et al., "An accurate permittivity measurement using Interferometric phase noise averaging for terahertz imaging," IEEE Transactions on Terahertz Science and Technology 8.3 (2018): 278-286.

SUMMARY

Technical Problem

As described above, in conventional methods for measuring the permittivity of an object, there are problems such as that the measurement error is high and the measurement time is long.

Means for Solving the Problem

In order to solve the foregoing problems, a permittivity measuring method according to an aspect of embodiments of the present invention includes: a step of measuring either one of a set of phases at sampling frequencies of at least three points in a first-half portion of a phase characteristic of electromagnetic waves that passed through a measurement target and a set of phases at sampling frequencies of at least three points in a second-half portion of the phase characteristic; a step of determining whether or not a phase change of the measured phases has extreme values; a step of, if the phase change of the measured phases has extreme values, calculating a permittivity by fitting the measured phases to a quadratic function; a step of measuring the other set of phases if the phase change of the measured phases does not have extreme values; a step of determining a mode of the phase changes of both sets of phases; a step of, if the mode of the phase changes of both sets of phases belongs to a phase group in which change of at least three points in a first half and change of at least three points in a second half are both monotonic change, are both maximal values, or are both minimal values, calculating the permittivity using a phase slope of the phases at the sampling frequencies of the at least three points in the first-half portion and the phases at the sampling frequencies of the at least three points in the second-half portion; and a step of, if the mode of the phase changes of both sets of phases does not belong to the phase group, calculating the permittivity by fitting the other set of phases to a quadratic function, wherein an interval between the sampling frequencies of the at least three points in the first-half portion and an interval fs between the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring method according to an aspect of embodiments of the present invention includes: a step of measuring a set of phases at sampling frequencies of at least three points in a first-half portion of a phase characteristic of electromagnetic waves that passed through a measurement target and a set of phases at sampling frequencies of at least three points in a second-half portion of the phase characteristic; a step of determining a mode of the phase changes of the sets of phases; a step of, if the mode of the phase changes of the sets of phases belongs to a phase group in which change of at least three points in a first half and change of at least three points in a second half are both monotonic change, are both maximal values, or are both minimal values, calculating a permittivity using a phase slope of the phases at the sampling frequencies of the at least three points in the first-half portion and the phases at the sampling frequencies of the at least three points in the second-half portion; and a step of, if the mode of the phase changes of the sets of phases does not belong to the phase group, calculating the permittivity by fitting one of the sets of measured phases to a quadratic function, wherein an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring device according to an aspect of embodiments of the present invention includes: means for measuring either one of a set of phases at sampling frequencies of at least three points in a first-half portion of a phase characteristic of electromagnetic waves that passed through a measurement target and a set of phases at sampling frequencies of at least three points in a second-half portion of the phase characteristic; means for determining whether or not a phase change of the measured phases has extreme values; means for, if the phase change of the measured phases has extreme values, calculating a permittivity by fitting the measured phases to a quadratic function; means for measuring the other set of phases if the phase change of the measured phases does not have extreme values; means for determining a mode of the phase changes of both sets of phases; means for, if the mode of the phase changes of both sets of phases belongs to a phase group in which change of at least three points in a first half and change of at least three points in a second half are both monotonic change, are both maximal values, or are both minimal values, calculating the permittivity using a phase slope of the phases at the sampling frequencies of the at least three points in the first-half portion and the phases at the sampling frequencies of the at least three points in the second-half portion; and means for, if the mode of the phase changes of both sets of phases does not belong to the phase group, calculating the permittivity by fitting the other set of phases to a quadratic function, wherein an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring device according to an aspect of embodiments of the present invention includes: means for measuring a set of phases at sampling frequencies of at least three points in a first-half portion of a phase characteristic of electromagnetic waves that passed through a measurement target and a set of phases at sampling frequencies of at least three points in a second-half portion of the phase characteristic; means for determining a mode of the phase changes of the sets of phases; means for, if the mode of the phase changes of the sets of phases belongs to a phase group in which change of at least three points in a first half and change of at least three points in a second half are both monotonic change, are both maximal values, or are both minimal values, calculating a permittivity using a phase slope of the phases at the sampling frequencies of the at least three points in the first-half portion and the phases at the sampling frequencies of the at least three points in the second-half portion; and means for, if the mode of the phase changes of the sets of phases does not belong to the phase group, calculating the permittivity by fitting one of the sets of measured phases to a quadratic function, wherein an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring device according to an aspect of embodiments of the present invention includes: a light source for emitting electromagnetic waves; a measuring unit for measuring electromagnetic waves that passed through a measurement target portion and measuring electromagnetic waves that passed through air; and an analysis unit for calculating a permittivity with use of the electromagnetic waves measured by the measuring unit, wherein the measuring unit measures either one of a set of phases at sampling frequencies of at least three points in a first-half portion of a phase characteristic of electromagnetic waves that passed through a measurement target and a set of phases at sampling frequencies of at least three points in a second-half portion of the phase characteristic, the analysis unit determines whether or not a phase change of the measured phases has extreme values, if the phase change of the measured phases has extreme values, the analysis unit calculates the permittivity by fitting the measured phases to a quadratic function, the measuring unit measures the other set of phases if the phase change of the measured phases does not have extreme values, the analysis unit determines a mode of the phase changes of both sets of phases, if the mode of the phase changes of both sets of phases belongs to a phase group in which change of at least three points in a first half and change of at least three points in a second half are both monotonic change, are both maximal values, or are both minimal values, the analysis unit calculates the permittivity using a phase slope of the phases at the sampling frequencies of the at least three points in the first-half portion and the phases at the sampling frequencies of the at least three points in the second-half portion, if the mode of the phase changes of both sets of phases does not belong to the phase group, the analysis unit calculates the permittivity by fitting the other set of phases to a quadratic function, an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring device according to an aspect of embodiments of the present invention includes: a light source for emitting electromagnetic waves; a measuring unit for measuring electromagnetic waves that passed through a measurement target portion and measuring electromagnetic waves that passed through air; and an analysis unit for calculating a permittivity with use of the electromagnetic waves measured by the measuring unit, wherein the measuring unit measures a set of phases at sampling frequencies of at least three points in a first-half portion of a phase characteristic of electromagnetic waves that passed through a measurement target and a set of phases at sampling frequencies of at least three points in a second-half portion of the phase characteristic, the analysis unit determines a mode of the phase changes of the sets of phases, if the mode of the phase changes of the sets of phases belongs to a phase group in which change of at least three points in a first half and change of at least three points in a second half are both monotonic change, are both maximal values, or are both minimal values, the analysis unit calculates the permittivity using a phase slope of the phases at the sampling frequencies of the at least three points in the first-half portion and the phases at the sampling frequencies of the at least three points in the second-half portion, if the mode of the phase changes of the sets of phases does not belong to the phase group, the analysis unit calculates the permittivity by fitting one of the sets of measured phases to a quadratic function, an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring program according to an aspect of embodiments of the present invention is for causing a permittivity measuring device to execute the processing of: determining whether a phase change of either one of a set of phases at sampling frequencies of at least three points in a first-half portion of a phase characteristic of electromagnetic waves that passed through a measurement target and a set of phases at sampling frequencies of at least three points in a second-half portion of the phase characteristic has extreme values; if the phase change of the measured phases has extreme values, calculating the permittivity by fitting the measured phases to a quadratic function; if the phase change of the measured phases does not have extreme values, determining the mode of the phase change of both sets of phases; if the mode of the phase changes of both sets of phases belongs to a phase group in which change of at least three points in a first half and change of at least three points in a second half are both monotonic change, are both maximal values, or are both minimal values, calculating the permittivity using a phase slope of the phases at the sampling frequencies of the at least three points in the first-half portion and the phases at the sampling frequencies of the at least three points in the second-half portion; and if the mode of the phase changes of both sets of phases does not belong to the phase group, calculating the permittivity by fitting the other set of phases to a quadratic function, wherein an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below.

Also, a permittivity measuring program according to an aspect of embodiments of the present invention is for causing a permittivity measuring device to execute the processing of: determining a mode of a phase change of a set of phases at sampling frequencies of at least three points in a first-half portion of a phase characteristic of electromagnetic waves that passed through a measurement target and a set of phases at sampling frequencies of at least three points in a second-half portion of the phase characteristic; if the mode of the phase changes of the sets of phases belongs to a phase group in which change of at least three points in a first half and change of at least three points in a second half are both monotonic change, are both maximal values, or are both minimal values, calculating the permittivity using a phase slope of the phases at the sampling frequencies of the at least three points in the first-half portion and the phases at the sampling frequencies of the at least three points in the second-half portion; and if the mode of the phase changes of the sets of phases does not belong to the phase group, calculating the permittivity by fitting one of the sets of measured phases to a quadratic function, wherein an interval between the sampling frequencies of the at least three points in the first-half portion and an interval fs of the sampling frequencies of the at least three points in the second-half portion satisfies Expression A below, and an interval fp between a lowest sampling frequency among the sampling frequencies of the at least three points in the first-half portion and a highest sampling frequency among the sampling frequencies of the at least three points in the second-half portion satisfies Expression B below:

Expressions $A$ and $B$ $$f_s < \frac{c}{16\sqrt{\varepsilon_{eff\_max}}L} \quad (A)$$

$$f_p < \frac{c}{(\sqrt{\varepsilon_{eff\_max}} - 1)L} \quad (B)$$

where L is a thickness of the measurement target, c is the speed of light, and εeff_max is the maximum value that can be taken by the effective permittivity of the measurement target.

Effects of Embodiments of the Invention

According to embodiments of the present invention, the permittivity of a measurement target can be measured faster and with higher accuracy.

BRIEF DESCRIPTION OF THE DRAWINGS

FIG. 8 is a diagram showing simulation results obtained by permittivity measuring methods according to the first embodiment and a second embodiment of the present invention.

DETAILED DESCRIPTION OF ILLUSTRATIVE EMBODIMENTS

First Embodiment

Figure 1:
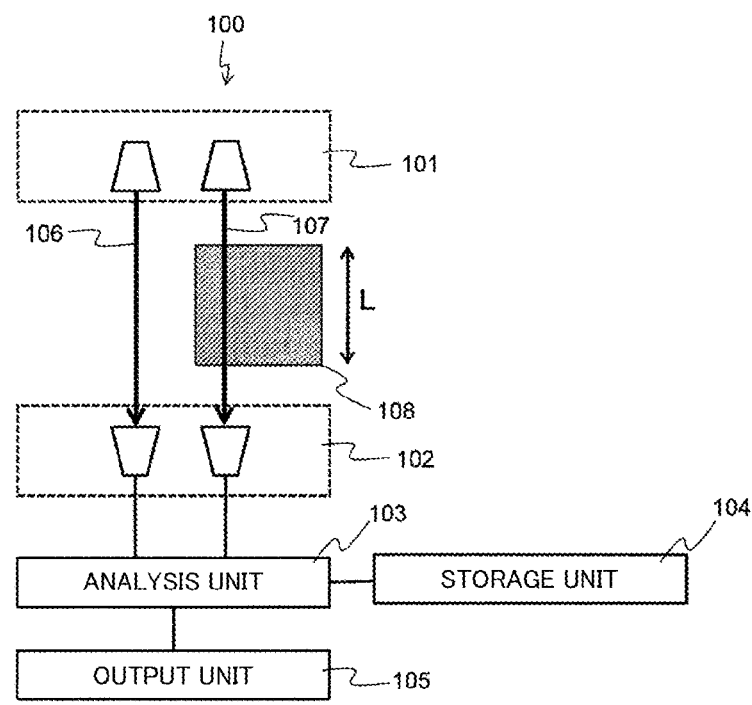
FIG. 1 is a configuration diagram of a permittivity measuring device according to a first embodiment of the present invention.

A first embodiment of the present invention will be described below with reference to FIGS. 1 to 8.
Configuration of Permittivity Measuring Device FIG. 1 shows the configuration of a permittivity measuring device 100 according to the present embodiment. The permittivity measuring device 100 includes a light source 101, a measuring unit 102, an analysis unit 103, a storage unit 104, and an output unit 105.

Electromagnetic waves 106 and 107 are emitted from the light source 101, one of which is transmitted through the air and the other of which is transmitted through the measurement target.

The measuring unit measures the electromagnetic waves 106 that were emitted from the light source 101 and passed through the air and the electromagnetic waves 107 that were emitted from the light source 101 and passed through a measurement target 108.

The analysis unit 103 calculates the phase rotation between the electromagnetic waves 106 and the electromagnetic waves 107 that were measured. In order to obtain a frequency characteristic of the obtained phase (phase characteristic), a measuring program read from the storage unit 104 is executed to calculate the permittivity of the measurement target 108. The analysis unit 103 calculates the permittivity using a permittivity measuring method (described later) according to any of the first to third embodiments of the present invention. Here, the calculation of the phase rotation may be included in the measuring program.

The output unit 105 outputs the permittivity calculation result. The output of the permittivity calculation result may be performed by display on a screen or by printing on paper or the like.
Principle of Permittivity Measuring Method The principle of the permittivity measuring method according to the present embodiment will be described below.

Figure 2:
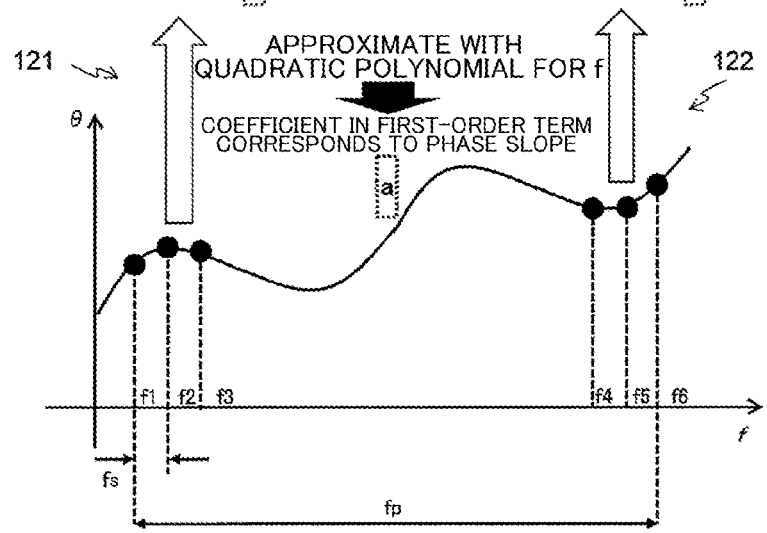
FIG. 2 is a diagram for describing a permittivity measuring method according to the first embodiment of the present invention.

FIG. 2 shows a conceptual diagram illustrating the principle of the permittivity measuring method according to the present embodiment.

In the permittivity measuring method according to the present embodiment, there are three frequencies at which sampling is performed (hereinafter referred to as "sampling frequency") in a first-half portion of the phase characteristic (hereinafter referred to as the "three first-half points") and also three sampling frequencies in a second-half portion (hereinafter referred to as the "three second-half points", and the phase is sampled (measured) only at these six sampling frequencies.

The polarity of the sampled phases is determined, and if the points are maximal points or minimal points (if they have an extreme value), the points are fitted to a quadratic function. Because the first-order term of the fitted curve corresponds to the phase slope, the relative permittivity is calculated using the first-order term. With the permittivity measuring method according to the present embodiment, a measurement accuracy equivalent to that of conventional methods can be realized with a smaller number of phase samplings than in conventional methods, and thus the measurement time can be reduced.

Figure 3:
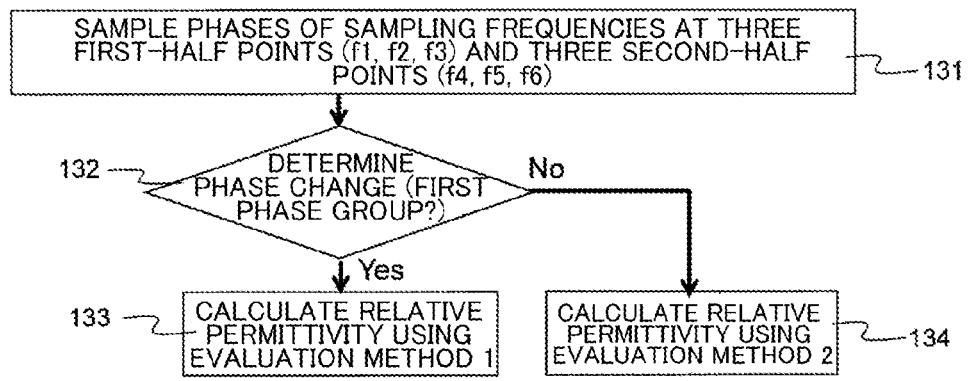
FIG. 3 is a flowchart of a permittivity measuring method according to the first embodiment of the present invention.

Details of the principle of the permittivity measuring method according to the present embodiment will be described below. FIG. 3 shows a flowchart of the permittivity measuring method according to the present embodiment.

First, phase sampling is performed at a total of six frequencies f1 to f6, namely three first-half points and three second-half points (step 131). At this time, an interval fs between adjacent sampling frequencies among the three first-half points and the three second-half points is set so as to satisfy the condition of Expression 3. This condition is a condition for making it possible to determine the polarity even when the period of phase fluctuation is the shortest.

Expression 3

$$f_s < \frac{c}{16\sqrt{\varepsilon_{\mathit{eff\_max}}}\, L} \quad (3)$$

In the present embodiment, the three first-half points are set to 100 GHz, 105 GHz, and 110 GHz, that is to say $f_s$=5 GHz and the start point is the lowest sampling frequency of 100 GHz in the measurement system used in phase measurement. Also, the three second-half points are set to 140 GHz, 145 GHz, and 150 GHz, that is to say $f_s$=5 GHz and the end point is the highest sampling frequency of 150 GHz in the measurement system used in phase measurement.

Here, $\varepsilon_{\mathit{eff\_max}}$ is the maximum value that can be taken by the effective permittivity of the measurement target.

Also, an interval $f_p$ between the frequencies f1 and f6, that is to say the interval between the lowest sampling frequency among the sampling frequencies of the three first-half points and the highest sampling frequency among the sampling frequencies of the three second-half points, is set so as to satisfy the condition of Expression 4. This condition is for ensuring that there is no phase change of 360° or more between f1 and f6. This is because if there is a phase change of 360° or more, the relative permittivity cannot be measured correctly due to the influence of phase jump.

Expression 4

$$f_p < \frac{c}{\left(\sqrt{\varepsilon_{\mathit{eff\_max}} - 1}\right)L} \qquad (4)$$

Figure 4:
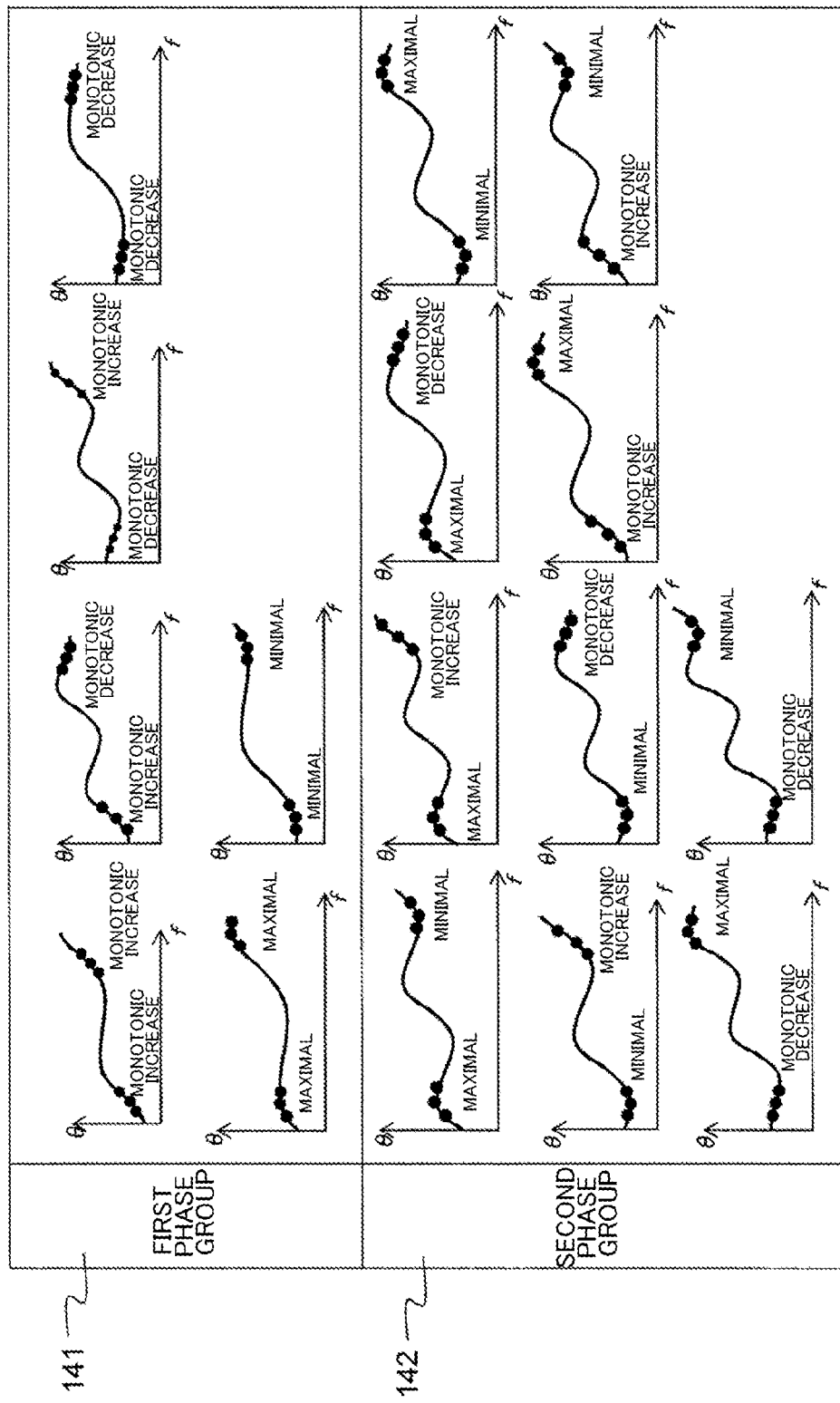
FIG. 4 is a diagram showing phase groups of phase characteristics in the permittivity measuring method according to the first embodiment of the present invention.

Next, the mode of the phase change is determined from the phases of the three first-half points and the three second-half points that were sampled (step 132). As shown in FIG. 4, phase change is classified into two patterns (phase groups) according to the mode thereof.

The first phase group (denoted by 141 in FIG. 4) applies if the polarities of the three first-half points and the three second-half points have any of the following six patterns: "monotonic increase-monotonic increase", "monotonic increase-monotonic decrease", "monotonic decrease-monotonic increase", "monotonic decrease-monotonic decrease", "maximal-maximal", or "minimal-minimal". In other words, if the change of the three first-half points and the change of the three second-half points both show monotonic change (monotonic increase or monotonic change), both show a maximal value, or both show a minimal value, the mode of phase change belongs to the first phase group.

In the case of the first phase group, the relative permittivity is calculated using Evaluation Method 1 (step 133). In Evaluation Method 1, the permittivity is calculated by a two-tone method using the phases f2 and f5, which are respectively the midpoints of the first-half portion and the second-half portion. In other words, the relative permittivity is calculated by substituting f2, f5, θ2 (phase of f2) and θ5 (phase of f5) into f1, f2, θ1 and θ2 of Expression 1. The reason for calculating the permittivity in the same manner as the conventional two-tone method is that in the case of these six patterns, the phase slope has a small deviation from the true value and a small measurement error.

On the other hand, if the mode of phase change does not belong to the first phase group, it belongs to the second phase group. Specifically, the second phase group (denoted by 142 in FIG. 4) applies if the polarities of the three first-half points and the three second-half points have any of the following ten patterns: (maximal-minimal), (maximal-monotonic increase), (maximal-monotonic decrease), (minimal-maximal), (minimal-monotonic increase), (minimal-monotonic decrease), (monotonic increase-maximal), (monotonic increase-minimal), (monotonic decrease-maximal), and (monotonic decrease-minimal).

In the case of the second phase group, the relative permittivity is calculated using Evaluation Method 2 (step 134). Details of Evaluation Method 2 will be described below with reference to FIG. 2.

First, assume that the phase characteristic includes only phase fluctuation caused by reflection two times (the influence of reflected waves at and after reflection of four reflections is sufficiently small). In the case where the phase change of any of the three first-half points and the three second-half points shows a maximal value, if the origin of the f axis is placed at the maximal point in FIG. 2, the phase θ can be expressed by Expression 5.

Expression 5

$$\theta = af + b \cos 2\pi t f \qquad (5)$$

Here, a is the true value of the phase slope, b is the magnitude of the phase fluctuation, and t is the period of the phase fluctuation. When focusing only on the vicinity of the maximal point, the cosine function can approximate θ to Expression 6, which is a quadratic function.

Expression 6

$$\theta \approx af + b\left(1 - \frac{1}{2}(2\pi t f)^2\right) \qquad (6)$$

Because the coefficient α in the first-order term of this quadratic function corresponds to the phase slope, the relative permittivity can be calculated by Expression 2. In actual measurement, if the three measured points are maximal values, the points are fitted to a quadratic function as described above, and the coefficient α in the first-order term is used to calculate the relative permittivity according to Expression 2.

If the phase change of either the three first-half points or the three second-half points shows minimal values, the points are fitted to Expression 7, which is a quadratic function, and the coefficient α in the first-order term can be used to calculate the relative permittivity according to Expression 2, similarly to the case of showing maximal values.

Expression 7

$$\theta \approx af - b\left(1 - \frac{1}{2}(2\pi t f)^2\right) \qquad (7)$$

If the phase changes of both the three first-half points and the three second-half points have extreme values (maximal values and minimal values), either the maximal values or the minimal values can be used to calculate the relative permittivity similarly to the above-described method.

Results of simulations performed to show the effect of embodiments of the present invention will be described below with reference to FIGS. 5 to 8. Expression 8 was used in the simulations. Here, a=2, b=1, and t=1.

Expression 8

$$\theta = af + b \sin 2\pi t f \qquad (8)$$

As described above, in the measuring method according to the present embodiment, a phase group is determined from the mode of the phase change of both the three first-half points and the three second-half points, and if the mode of the phase change belongs to the first phase group, the permittivity is calculated using the phase slope obtained from the phase at the sampling frequency at both one point among the three first-half points and one point among the three second-half points, whereas if the mode of the phase change belongs to the second phase group, the permittivity is calculated by fitting the phase change of either the three first-half points or the three second-half points to a quadratic function.

Figure 5:
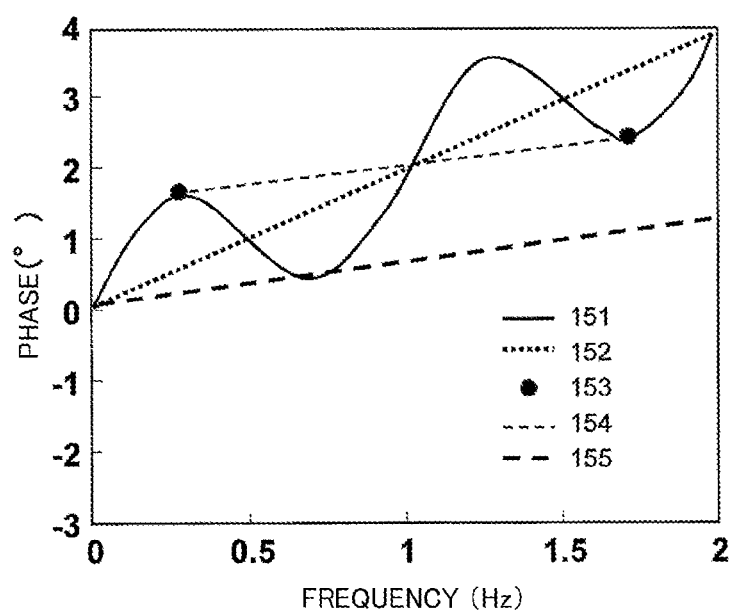
FIG. 5 is a conceptual diagram of phase characteristics for describing a permittivity measuring method that uses a two-tone method.
Figure 6:
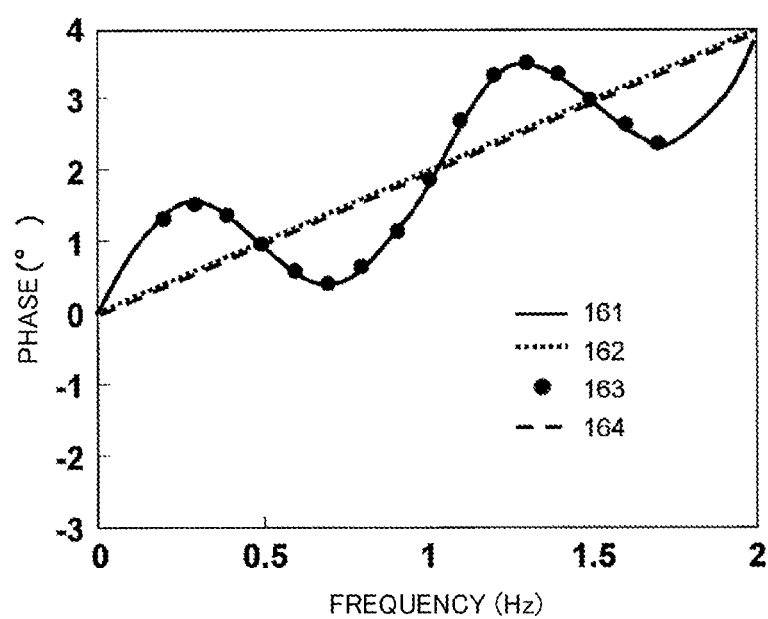
FIG. 6 is a conceptual diagram of phase characteristics for describing a permittivity measuring method that uses a phase fluctuation averaging method.
Figure 7:
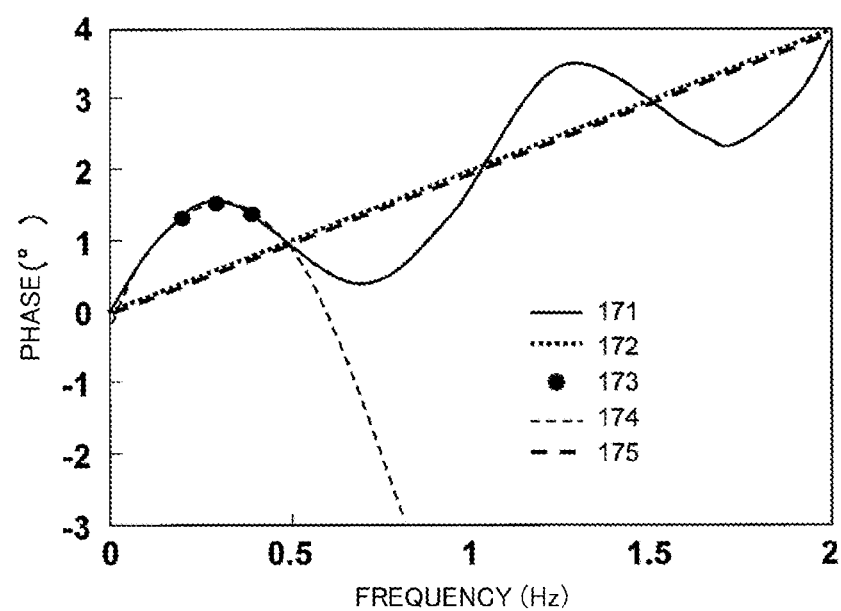
FIG. 7 is a conceptual diagram of phase characteristics for describing the permittivity measuring method according to the first embodiment of the present invention.

FIGS. 5, 6 and 7 show conceptual diagrams of the phase characteristic when using the two-tone method, the phase fluctuation averaging method, and the measuring method according to the present embodiment, respectively. When the two-tone method is used, an estimated straight line 155, which is obtained by performing fitting 154 at phase sampling points 153 of a characteristic 151 that has phase fluctuation, deviates greatly from a characteristic (true value) 152 that assumes no phase fluctuation (FIG. 5).

When the phase fluctuation averaging method is used, an estimated straight line 164, which is obtained using phase sampling points 163 of a characteristic 161 that has phase fluctuation, substantially matches a characteristic (true value) 162 that assumes no phase fluctuation (FIG. 6).

When the measuring method according to the present embodiment is used, an estimated straight line 175, which is obtained by performing fitting 174 at phase sampling points 173 of a characteristic 171 that has phase fluctuation, substantially matches a characteristic (true value) 172 that assumes no phase fluctuation (FIG. 7).

FIG. 8 shows the error from the true value in each method according to the simulations. FIG. 8 also shows the estimated measurement time assuming that the time required for one sampling point is 10 msec. In the case of the conventional methods, the error from the true value is 68% in the two-tone method and 1% in the phase fluctuation averaging method. On the other hand, the error from the true value is 1% in the measuring method according to the present embodiment.

In the case of the conventional methods, the measurement time is 20 msec in the two-tone method and 160 msec in the phase fluctuation averaging method. On the other hand, the measurement time is 60 msec in the measuring method according to the present embodiment.

As described above, when compared with the conventional two-tone method, the error rate can be reduced from 68% to 1% by using the measuring method according to the present embodiment. Also, when compared with the conventional phase fluctuation averaging method, an equivalent error percentage can be realized, but the number of frequencies used for measurement (number of phase samples) and measurement time can be reduced to about ⅓.

As described above, with the measuring method according to the present embodiment, both the measurement error and the measurement time can be reduced in compared with conventional methods.

Second Embodiment

Next, a second embodiment of the present invention will be described.

Figure 9:
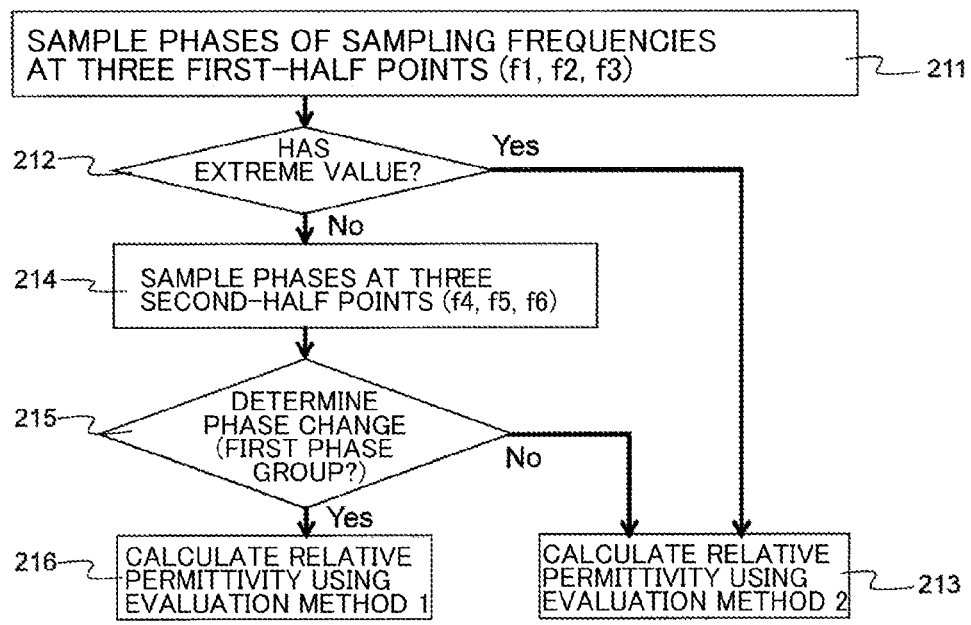
FIG. 9 is a flowchart of the permittivity measuring method according to the second embodiment of the present invention.

FIG. 9 shows a flowchart of the permittivity measuring method according to the second embodiment.

First, the phase is measured at three first-half points (f1 to f3) (step 211).

Next, it is determined whether or not there is an extreme value in the phase change at the three first-half points (f1 to f3) (step 212).

If there is an extreme value, the relative permittivity is calculated using Evaluation Method 2 (step 213). If the extreme value is a maximal value, the relative permittivity is calculated using Expression 6. If the extreme value is a minimal value, the relative permittivity is calculated using Expression 7.

If there is no extreme value, the phase is measured at the three second-half points (f4 to f6) (step 214).

Next, the pattern (phase group) of the mode of phase change at the three second-half points (f4 to f6) is determined (step 215).

In the case of the first phase group, the relative permittivity is calculated using Evaluation Method 1 (step 216).

In the case of the second phase group, the relative permittivity is calculated using Evaluation Method 2 (step 213). If the extreme value is a maximal value, the relative permittivity is calculated using Expression 6. If the extreme value is a minimal value, the relative permittivity is calculated using Expression 7.

As described above, the measuring method according to the first embodiment uses frequencies at six points. However, if the phase change of the three first-half points has an extreme value, it is not necessary to measure the phase of the three second-half points. In the measuring method according to the present embodiment, when phase measurement at the three first-half points ends, the polarity is determined, and if there is a maximal or a minimal value (if there is an extreme value), the measurement of the three second-half points can be omitted, thus making it possible to reduce the measurement time by half.

In the present embodiment, the three first-half points are measured first, but the three second-half points may be measured first. If the three second-half points are measured first, and the second-half portion has an extreme value, measurement of the first-half portion can be omitted. If the second-half portion does not have an extreme value, the phases of the three first-half points are subsequently measured, the phase group is determined, and the relative permittivity is calculated in accordance with the determined phase group.

As shown in FIG. 9, in the measuring method according to the present embodiment, the error from the true value is 1%. Also, the measurement time when there is an extreme value is 30 msec, which is a reduction to ½ as compared with the first embodiment. As described above, according to the present embodiment, the measurement error can be reduced and the measurement time can be further reduced in comparison with conventional methods.

Third Embodiment

Next, a third embodiment of the present invention will be described.

When Evaluation Method 1 is used, the wider the frequency interval between f2 and f5 is, the smaller the measurement error can be. However, as described in the first embodiment, in order to prevent the phase from changing by 360° or more, the frequency interval between f1 and f6 cannot be expanded beyond the condition of Expression 4. Because the frequency interval between f1 and f6 is limited in this way, the frequency interval between f2 and f5 cannot be extended indefinitely.

Figure 10:
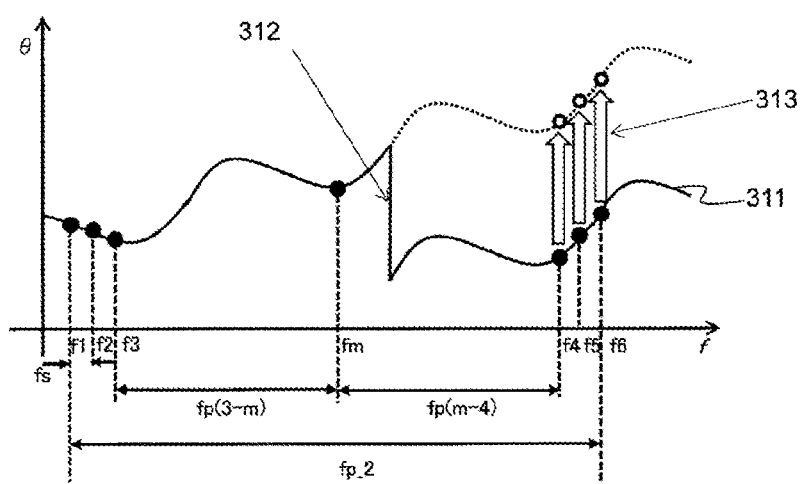
FIG. 10 is a diagram for describing a permittivity measuring method according to a third embodiment of the present invention.

In the present embodiment, as shown in FIG. 10, the interval between f1 and f6 is set so as to satisfy the condition of Expression 9. Here, fs remains defined by Expression 3. The interval setting shown in Expression 9 corresponds to doubling the distance between the three first-half points and the three second-half points described in the first embodiment. In this case, the phase may change by 360° or more between the first-half portion and the second-half portion as shown by the solid line 311 in FIG. 10, and the relative permittivity cannot be measured correctly, and thus the following processing is performed.

Expression 9

$$f_{p\_2} < \frac{2c}{(\sqrt{\varepsilon_{eff\_max}} - 1)L} \quad (9)$$

Figure 11:
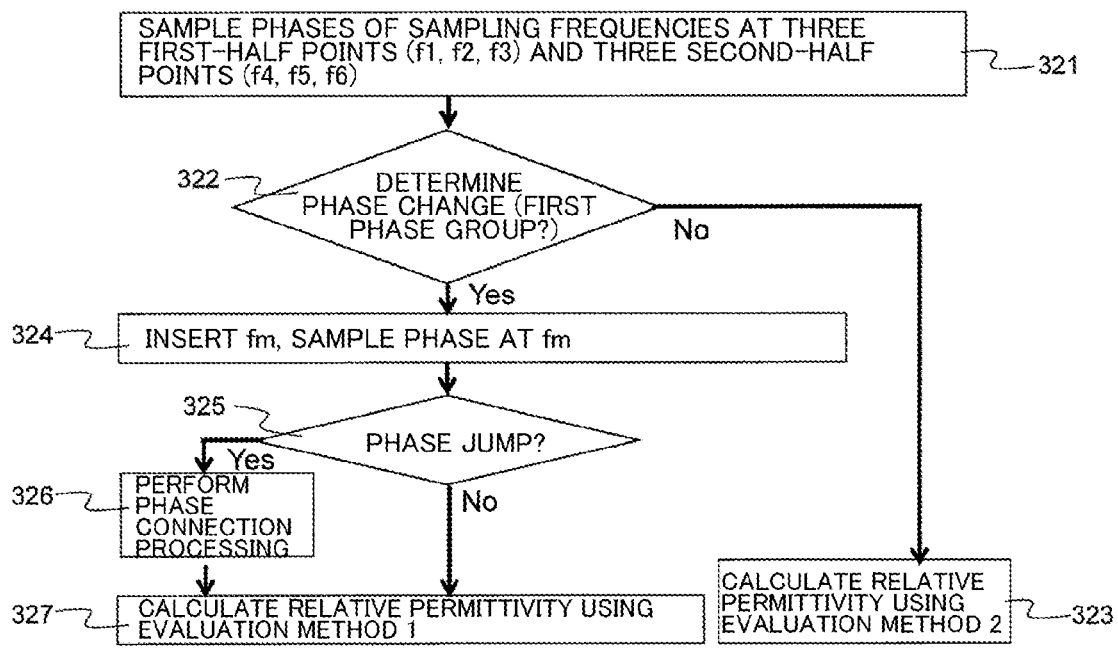
FIG. 11 is a flowchart of the permittivity measuring method according to the third embodiment of the present invention.
Figure 12:
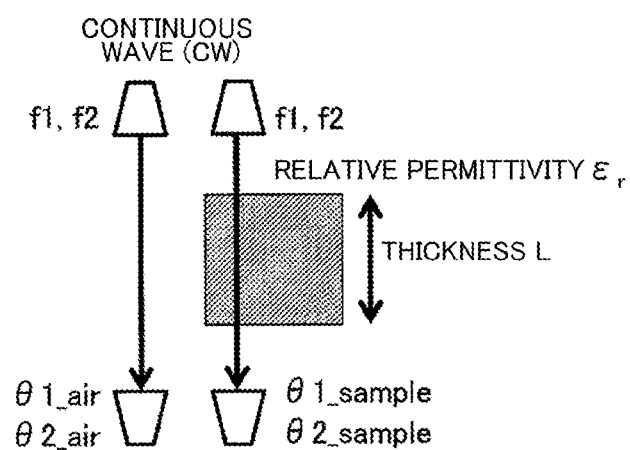
FIG. 12 is a configuration diagram of a measurement system in a conventional method (two-tone method).
Figure 13:
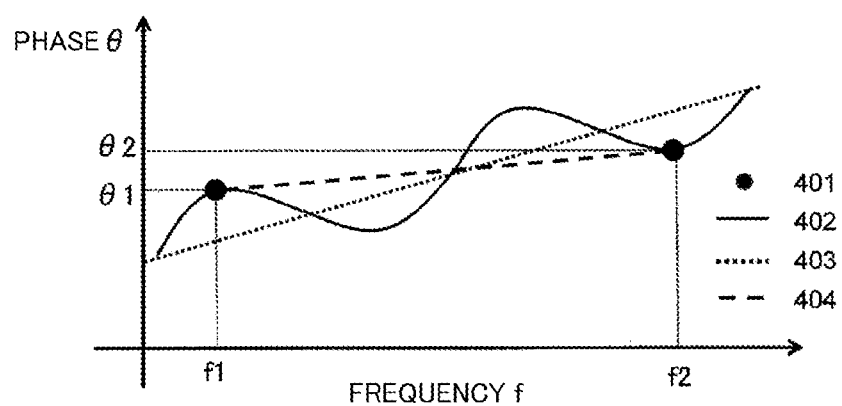
FIG. 13 is a diagram for describing a conventional method (two-tone method).
Figure 14:
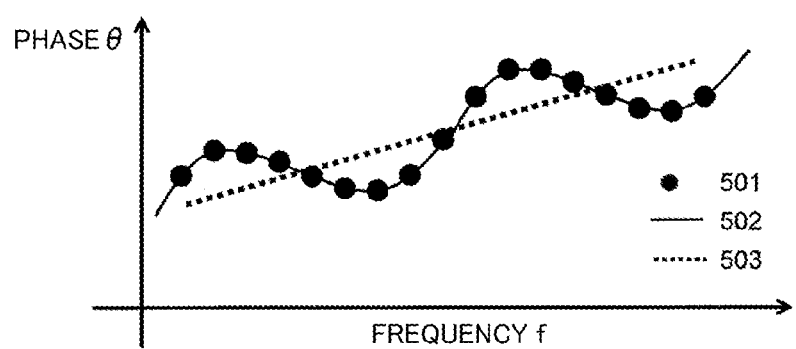
FIG. 14 is a diagram for describing a conventional method (phase fluctuation averaging).

FIG. 11 shows a flowchart of the permittivity measuring method according to the third embodiment.

First, similarly to the first embodiment, phase sampling is performed at the three first-half points and the three second-half points (step 321), and the mode of the phase change is determined (step 322). If the mode of phase change is the second phase group, the relative permittivity is calculated using Evaluation Method 2 (step 323). If the mode of phase change is the first phase group, the relative permittivity is calculated as follows.

If it is determined that Evaluation Method 1 is to be used, another frequency fm is inserted between f3 and f4, and the phase of only fm is sampled (step 324). At this time, the phases of f1 to f6 are not sampled again. The frequency interval $f_p(3-m)$ between f3 and fm and the frequency interval $f_p(m-4)$ between fm and f4 are set so as to satisfy the frequency interval condition shown in Expression 4.

Next, it is determined whether or not a phase jump has occurred (step 325). Here, a phase jump means that the phase characteristic becomes discontinuous and the phase drops sharply between adjacent sampling frequencies (denoted by 312 in FIG. 1).

The presence or absence of a phase jump can be determined based on a predetermined criterion. For example, if the difference between the phase at fm and the phase at f4 is larger than the fluctuation width of the phase characteristic at the maximum permittivity by a margin (allowable amount), it can be determined that a phase jump has occurred. For example, the margin (allowable amount) may be 50°, 200 or 70°.

Here, with respect to the electromagnetic wave that passes directly through the measurement target (hereinafter referred to as the "direct wave") and the reflected electromagnetic wave (hereinafter referred to as the "reflected wave"), the fluctuation width of the phase characteristic is the phase difference between the vector of the direct wave and the composite vector of the direct wave and the reflected wave, and is the highest when the angle between the direct wave vector and the reflected wave vector is a right angle. Expression 10 shows the fluctuation width $\theta_{error}$ of the phase characteristic at the highest permittivity.

Expression 10

$$\theta_{error} = \arctan\left(\left[\frac{\sqrt{\varepsilon_{eff\_max}} - 1}{\sqrt{\varepsilon_{eff\_max}} + 1}\right]^2\right) \quad (10)$$

If it is determined that a phase jump occurred between fm and f4, phase connection processing (denoted by 313 in FIG. 1) is performed to add 360° to the phases at f4 to f6 that were already sampled (step 326). Here, if a phase jump has not occurred, phase connection processing is not performed.

Then, using the phases at f2 and f5 (if phase connection is required, the phase at f5 after phase connection), the permittivity is calculated using Evaluation Method 1 (two-tone method) (step 327).

With the measuring method according to the present embodiment, the frequency interval between f2 and f5 can be widened, and the measurement error can be reduced.

In the present embodiment, one frequency fm is added, but a plurality of frequencies may be added. If N frequencies fm1, fm2, ... fmN are added, the interval $f_{p\_N}$ between f1 and f6 is set as shown in Expression 11. Here, N is an integer of 1 or more.

Expression 11

$$f_{p\_N} < \frac{Nc}{(\sqrt{\varepsilon_{eff\_max}} - 1)L} \quad (11)$$

$$N = 1, 2, 3 \ldots$$

At this time, fs remains set as previously described. Also, all intervals between adjacent sampling frequencies from f3 to f4 (f3 and fm1, fm1 and fm2, fm2 and fm3, ... fmN and f4) are set so as to satisfy the frequency interval condition shown in Expression 4.

In phase connection processing, 360° is added to the phases of all sampling frequencies after the frequency at which the phase jump occurs. If a phase jump occurs multiple times, this processing is also performed multiple times. In other words, if a phase jump occurs M times, this processing is also performed M times. For example, if two phase jumps occur, 720° is ultimately added to the phase at f5.

As described above, according to the present embodiment, when Evaluation Method 1 is used, the interval between the sampling frequencies used for measurement can be widened, and thus measurement can be performed with higher accuracy.

In the embodiments of the present invention, the sampling frequencies at the three first-half points and the three second-half points need only be set such that the phase slope can be acquired (calculated) by Evaluation Method 1, and it is sufficient that the sampling frequencies are set at three points in each of two frequency regions of the phase characteristic, and that the phase slope is acquired (calculated) separately for the first half and the second half. Here, as described above, with Evaluation Method 1, the measurement accuracy can be improved when the interval between the sampling frequencies of two points for calculating the phase slope is wide. Accordingly, it is desirable to set the sampling frequencies of the three first-half points and the three second-half points near the lower limit and the upper limit, respectively, of the measurement frequency range defined by Expression 11.

In the embodiments of the present invention, the phase is measured at the sampling frequencies of the three first-half points and the three second-half points, but the phase may be measured at sampling frequencies of three or more points in each of the first half and the second half. As described above, the measuring method according to embodiments of the present invention, which uses the sampling frequencies of the three first-half points and the three second-half points, has a measurement accuracy equivalent to that of the phase fluctuation averaging method that uses sampling frequencies over the entire phase characteristic, and in consideration of this, even if the sampling frequencies of three or more points in the first half and the second half are used, a similar effect can be obtained in terms of measurement accuracy. Because the measurement time depends on the sampling count, the measurement time can be reduced if the sampling count is smaller than that in the phase fluctuation averaging method, and a sufficient effect is achieved even if the sampling count is around 10. In this way, it is sufficient that the phase is measured at the sampling frequencies of at least three points in the first half and at least three points in the second half.

In the embodiments of the present invention, examples of calculating the relative permittivity of a measurement target are described, but the permittivity of a measurement target is known to be obtained by multiplying the relative permittivity of the measurement target by the permittivity of a vacuum, and therefore it is clear that as long as the relative permittivity of the measurement target can be calculated (measured), the permittivity can be calculated (measured).

The permittivity measuring device according to the embodiments of the present invention can be realized by a computer that includes a CPU (Central Processing Unit), a storage device, and an interface, and furthermore a program for controlling such hardware resources.

In the permittivity measuring device according to the embodiments of the present invention, the computer is provided inside the device, but the permittivity measuring device may be realized with use of an external computer. Also, the storage unit may also be a storage medium that is external to the device, and the measuring program stored in the storage medium may be read out and executed. Examples of the storage medium include various magnetic recording media, an optical magnetic recording medium, a CD-ROM, a CD-R, and various memories. Also, the measuring program may be supplied to the computer via a communication line such as the Internet.

INDUSTRIAL APPLICABILITY

Embodiments of the present invention can be applied to a technique for measuring the relative permittivity of an object using electromagnetic waves.

REFERENCE SIGNS LIST

100 Permittivity measuring device
101 Light source
102 Measuring unit
103 Analysis unit
104 Storage unit
105 Output unit
106, 107 Electromagnetic wave
108 Measurement target

The invention claimed is:

1. A permittivity measuring method comprising:
measuring a first set of phases at sampling frequencies of at least three points in a first-half portion of a phase characteristic of electromagnetic waves that passed through a measurement target or a second set of phases at sampling frequencies of at least three points in a second-half portion of the phase characteristic;
determining whether or not a phase change of the measured first or second set of phases has an extreme value;
in response to a determination that the phase change of the measured first or second set of phases has the extreme value, calculating a permittivity by fitting the measured first or second set of phases to a quadratic function; and
in response to a determination that the phase change of the measured first or second set of phases does not have the extreme value:
measuring the other set of the first and second set of phases;
determining a mode of the phase changes of both the first and second sets of phases;
in response to the mode of the phase changes of both the first and second sets of phases belonging to a phase group in which change of at least three points in a first half and change of at least three points in a second half are both monotonic change, are both maximal values, or are both minimal values, calculating the permittivity using a phase slope of the phases at the sampling frequencies of the at least three points in the first-half portion and the phases at the sampling frequencies of the at least three points in the second-half portion; and
in response to the mode of the phase changes of both the first and second sets of phases not belonging to the phase group, calculating the permittivity by fitting the other set of the first and second phases to a quadratic function;
wherein an interval between the sampling frequencies of the at least three points in the first-half portion and an interval $f_s$ between the sampling frequencies of the at least three points in the second-half portion satisfies $$f_s < \frac{c}{16\sqrt{\varepsilon_{\mathit{eff\_max}}}L},$$

in which L is a thickness of the measurement target, c is the speed of light, and $\varepsilon_{\mathit{eff\_max}}$ is a maximum value that can be taken by an effective permittivity of the measurement target; and
wherein an interval $f_p$ between a lowest sampling frequency among the sampling frequencies of the at least three points in the first-half portion and a highest sampling frequency among the sampling frequencies of the at least three points in the second-half portion satisfies $$f_p < \frac{c}{(\sqrt{\varepsilon_{\mathit{eff\_max}}} - 1)L}.$$

2. The permittivity measuring method according to claim 1, further comprising:
in response to the mode of the phase changes of both the first and second sets of phases belonging to the phase group in which change of the at least three points in the first half and change of the at least three points in the second half are both monotonic change, are both maximal values, or are both minimal values, measuring the phase at N sampling frequencies between the first-half portion and the second-half portion;
determining whether or not a phase jump has occurred between the N sampling frequencies and the first-half portion or the second-half portion; and
in response to a determination that the phase jump has occurred, performing phase connection processing, wherein an interval $f_{p\_N}$ between a lowest sampling frequency among the sampling frequencies of the at least three points in the first-half portion and a highest sampling frequency among the sampling frequencies of the at least three points in the second-half portion satisfies $$f_{p\_N} < \frac{Nc}{(\sqrt{\varepsilon_{\mathit{eff\_max}}} - 1)L}$$

-continued $$N = 1, 2, 3 \ldots.$$

3. A system for performing the permittivity measuring method according to claim 1, wherein the system comprises:
a light source;
a measuring device configured to measure the electromagnetic waves emitted from the light source; and
an analyzer configured to calculate the permittivity using the electromagnetic waves measured by the measuring device.

4. A permittivity measuring method comprising:
measuring a first set of phases at sampling frequencies of at least three points in a first-half portion of a phase characteristic of electromagnetic waves that passed through a measurement target and a second set of phases at sampling frequencies of at least three points in a second-half portion of the phase characteristic;
determining a mode of the phase changes of both the first and second sets of phases;
in response to a determination that the mode of the phase changes of both the first and second sets of phases belong to a phase group in which change of at least three points in a first half and change of at least three points in a second half are both monotonic change, are both maximal values, or are both minimal values, calculating a permittivity using a phase slope of the phases at the sampling frequencies of the at least three points in the first-half portion and the phases at the sampling frequencies of the at least three points in the second-half portion; and
in response to a determination that the mode of the phase changes of both the first and second sets of phases does not belong to the phase group, calculating the permittivity by fitting one of the first and second sets of measured phases to a quadratic function;
wherein an interval between the sampling frequencies of the at least three points in the first-half portion and an interval $f_s$ of the sampling frequencies of the at least three points in the second-half portion satisfies $$f_s < \frac{c}{16\sqrt{\varepsilon_{\mathit{eff\_max}}}L},$$

in which L is a thickness of the measurement target, c is the speed of light, and $\varepsilon_{\mathit{eff\_max}}$ is a maximum value that can be taken by an effective permittivity of the measurement target; and
wherein an interval $f_p$ between a lowest sampling frequency among the sampling frequencies of the at least three points in the first-half portion and a highest sampling frequency among the sampling frequencies of the at least three points in the second-half portion satisfies $$f_p < \frac{c}{\left(\sqrt{\varepsilon_{\mathit{eff\_max}}} - 1\right)L}.$$

5. The permittivity measuring method according to claim 4, further comprising:
in response to the mode of the phase changes of both the first and second sets of phases belonging to the phase group in which change of the at least three points in the first half and change of the at least three points in the second half are both monotonic change, are both maximal values, or are both minimal values, measuring the phase at N sampling frequencies between the first-half portion and the second-half portion;
determining whether or not a phase jump has occurred between the N sampling frequencies and the first-half portion or the second-half portion; and
in response to a determination that the phase jump has occurred, performing phase connection processing, wherein an interval $f_{p\_N}$ between a lowest sampling frequency among the sampling frequencies of the at least three points in the first-half portion and a highest sampling frequency among the sampling frequencies of the at least three points in the second-half portion satisfies $$f_{p\_N} < \frac{Nc}{\left(\sqrt{\varepsilon_{\mathit{eff\_max}}} - 1\right)L}$$

$$N = 1, 2, 3 \ldots.$$

6. A system for performing the permittivity measuring method according to claim 4, wherein the system comprises:
a light source;
a measuring device configured to measure the electromagnetic waves emitted from the light source; and
an analyzer configured to calculate the permittivity using the electromagnetic waves measured by the measuring device.

7. A permittivity measuring device comprising:
a light source configured to emit electromagnetic waves;
a measuring device configured to measure the electromagnetic waves that passed through a measurement target portion and to measure the electromagnetic waves that passed through air; and
an analyzer configured to calculate a permittivity with use of the electromagnetic waves measured by the measuring device;
wherein the measuring device is configured to measure a first set of phases at sampling frequencies of at least three points in a first-half portion of a phase characteristic of electromagnetic waves that passed through a measurement target or a second set of phases at sampling frequencies of at least three points in a second-half portion of the phase characteristic;
wherein the analyzer is configured to determine whether or not a phase change of the measured first or second set of phases has an extreme value;
wherein, in response to a determination that the phase change of the measured first or second set of phases has the extreme value, the analyzer is configured to calculate the permittivity by fitting the measured first or second set of phases to a quadratic function;
wherein, in response to a determination that the phase change of the measured first or second set of phases does not have the extreme value:
the measuring device is configured to measure the other set of the first and second set of phases;
the analyzer is configured to determine a mode of the phase changes of both the first and second sets of phases;
in response to a determination that the mode of the phase changes of both the first and second sets of phases belongs to a phase group in which change of at least three points in a first half and change of at least three points in a second half are both monotonic change, are both maximal values, or are both minimal values, the analyzer is configured to calculate the permittivity using a phase slope of the phases at the sampling frequencies of the at least three points in the first-half portion and the phases at the sampling frequencies of the at least three points in the second-half portion; and in response to a determination that the mode of the phase changes of both the first and second sets of phases does not belong to the phase group, the analyzer is configured to calculate the permittivity by fitting the other set of the first and second sets of phases to a quadratic function;

wherein an interval between the sampling frequencies of the at least three points in the first-half portion and an interval $f_s$ of the sampling frequencies of the at least three points in the second-half portion satisfies $$f_s < \frac{c}{16\sqrt{\varepsilon_{eff\_max}}L},$$

in which L is a thickness of the measurement target, c is the speed of light, and $\varepsilon_{eff\_max}$ is a maximum value that can be taken by an effective permittivity of the measurement target; and an interval $f_p$ between a lowest sampling frequency among the sampling frequencies of the at least three points in the first-half portion and a highest sampling frequency among the sampling frequencies of the at least three points in the second-half portion satisfies $$f_p < \frac{c}{\left(\sqrt{\varepsilon_{eff\_max}} - 1\right)L}.$$

8. The permittivity measuring device according to claim 7, wherein:

in response to the mode of the phase changes of both the first and second sets of phases belonging to the phase group in which change of the at least three points in the first half and change of the at least three points in the second half are both monotonic change, are both maximal values, or are both minimal values, the measuring device is configured to measure the phase at N sampling frequencies between the first-half portion and the second-half portion;

the analyzer is configured to determine whether or not a phase jump has occurred between the N sampling frequencies and the first-half portion or the second-half portion; and in response to a determination that the phase jump has occurred, the analyzer is configured to perform phase connection processing, wherein an interval $f_{p\_N}$ between a lowest sampling frequency among the sampling frequencies of the at least three points in the first-half portion and a highest sampling frequency among the sampling frequencies of the at least three points in the second-half portion satisfies $$f_{p\_N} < \frac{Nc}{\left(\sqrt{\varepsilon_{eff\_max}} - 1\right)L}$$

$$N = 1, 2, 3 \ldots.$$

* * * * *